(12) United States Patent
Pettersson et al.

(10) Patent No.: US 6,541,835 B1
(45) Date of Patent: Apr. 1, 2003

(54) INTEGRATED ΔE-E DETECTOR TELESCOPE

(76) Inventors: Sture Pettersson, Sandmovägen 5B, Uppsala (SE), SE-756 47; Göran Thungström, Tegelbruksgatan 24, Sundsvall (SE), SE-853 56; Harry Whitlow, Gullregnsvägen 12, Lund (SE), SE-224 56

(*) Notice: Subject to any disclaimer, the term of this patent is extended or adjusted under 35 U.S.C. 154(b) by 803 days.

(21) Appl. No.: 09/159,609

(22) Filed: Sep. 24, 1998

Related U.S. Application Data

(63) Continuation of application No. PCT/SE97/00475, filed on Mar. 20, 1997.

(30) Foreign Application Priority Data

Mar. 29, 1996 (SE) ............................................. 9601235

(51) Int. Cl.⁷ ............................................. H01L 31/115
(52) U.S. Cl. ........................................................ 257/429
(58) Field of Search ................................................. 257/429

(56) References Cited

U.S. PATENT DOCUMENTS

| | | | | |
|---|---|---|---|---|
| 3,511,722 A | * | 5/1970 | Meuleman | 148/175 |
| 4,340,899 A | * | 7/1982 | Husimi et al. | 357/29 |
| 4,998,151 A | | 3/1991 | Korman et al. | |
| 5,382,832 A | * | 1/1995 | Buti et al. | 257/773 |
| 5,387,555 A | | 2/1995 | Linn et al. | |
| 5,654,226 A | * | 8/1997 | Temple et al. | 438/458 |

FOREIGN PATENT DOCUMENTS

EP         0616376         9/1994

OTHER PUBLICATIONS

Kim et al. Epitaxial Integrated dE1—dE2 Silicon Detectors Nucl. Inst. and Meth. in Phys Res. V 226 pp 125–128, 1982.*

Patent Abstracts of Japan, vol. 10, No. 117, E–400, abstract of JP,A, 60–251678 (Nippon Dehshin Denwa Kosha).

K. Husimi, et al., Epitaxial Integrated $dE_1$–$dE_2$ Silicon Detectors, Nuclear Instruments and Methods in Physics Research, vol. 226, 1984 pp. 125–128.

K. Husimi, et al., Application of Epitaxial Crystal Growth on Silicon Radiation Detectors, Nuclear Instruments and Methods In Physics Research. vol. 196 (1982) pp. 131–136.

H.J. Whitlow, et al., Development of Si–Based Detectors for Intermediate Energy Heavy–Ion Physics at a Storage–Ring Accelerator, Proc. 9th Australian Conf. on Nuclear Techniques of Analysis, Newcastle, Australia, Nov. 1995, 3 pgs.

J. Kemmer, Fabrication of Low Noise Silicon Radiation Detectors by the the Planar Process, Nuclear Instruments and Methods, vol. 169, 1980, pp. 499–502.

(List continued on next page.)

Primary Examiner—Olik Chaudhuri
Assistant Examiner—Douglas A. Wille
(74) Attorney, Agent, or Firm—Young & Thompson

(57) ABSTRACT

A device forming a high energy resolution integrated semiconductor ΔE-E detector telescope is disclosed, in which is formed a very thin ΔE detector portion (14) primarily fabricated from a first semiconductor wafer which is bonded/silicidized to a second semiconductor wafer forming an E detector portion (18). This ΔE-E detector provides a well supported very thin ΔE detector for high resolution. The very thin ΔE detector portion bonded/silicidized to the E detector portion further provides between each other a buried metallic layer (16) acting as a contact common to the two detectors, which metal layer is thin and presents a low resistivity.

16 Claims, 4 Drawing Sheets

OTHER PUBLICATIONS

J. Kemmer and G. Lutz, New Detector Concepts, Nuclear Instruments and Methods in Physics Research, A253, 1987, North–Holland, Amsterdam pp. 365–377.

Karin Ljungberg, Anders Soderbarg, Goran Thungstrom and Sture Petersson, "Buried Silicide Layers in Silicon Using Wafer Bonding with Cobalt as Interfacial Layer", Proceedings of The Second International Symposium On Semiconductor Wafer Bonding: Science, Technology, and Applications, Electronics and Dielectric Science and Technology Divisions, Proceedings vol. 93–29, Aug. 1992, pp. 249–256.

Goran Thungstrom, Christer Frojdh, Per Svedberg and C. Sture Petersson, "Contacts to Monocrystalline N– and P–Typse Silicon by Wafer Bonding Using Cobalt Disilicide" Physica Scripta. vol. T54, 77–80, 1994.

Goran Thungstrom, Christer Frojdh and C. Sture Petersson "Buried Schottky Contacts in Patterned Cobalt Silicide Layers in Silicon Using Wafer Bonding", Materials Research Society, Mat. Res. Soc. Symp, Proc. vol. 337, 1994, pp. 475–480.

* cited by examiner

INTEGRATED ΔE-E DETECTOR TELESCOPE

This is a continuation of copending international application PCT/SE97/00475 filed Mar. 20, 1997, which designates the United States.

TECHNICAL FIELD

The present invention relates to a semiconductor detector and more exactly to an integrated ΔE-E detector.

GENERAL BACKGROUND OF THE INVENTION

In many branches of science there is a need to measure energetic atoms with subrelativistic energies. Examples include, mineral prospecting with accelerator mass spectrometry, spacecraft measurements of the solar wind as well as interplanetary and galactic radiation environments, nuclear microprobe analysis of light trace distributions in biomedical matter, recoil spectrometry characterization of opto- and microelectronic structures as well as fundamental experimental physics. Depending on the particular circumstances, a number of different techniques are available, such as electrostatic- and magnetic-sector spectrometers, Time of Flight techniques, scintillation detectors as well as semiconductors and gas-ionization detectors. Often the different techniques are combined, e.g., a magnetic spectrometer analyzer may be combined with a gas ionization detector to facilitate separate measurement of the momentum, atomic number and energy.

For measurement of the atomic number as well as the energy of energetic atoms and ions in the 5 MeV per nucleon to 0.1 GeV per nucleon energy region, a so-called ΔE-E detector telescope is often used. These consist of a pair of detectors arranged so that the particle traverses the first detector and is subsequently stopped in the second (thicker) detector. The atomic number can be determined because the energy deposition within the thickness spanned by the ΔE detector depends on the electrical charge on the nucleus of the energetic atom (atom number). The total energy is the sum of the energy deposited in the two detectors. Exactly how the deposited energy is converted into an electrical signal depends on the type of detector. In the energy region of interest almost all the energy is deposited in exciting electrons of the detector material. In the case of a gas-ionization detector the number of ion-electron pairs can be registered. In the case of solid detector materials (scintillator and semiconductors) the electronic energy deposition leads to promotion of electrons across the band gap. This leads to photon emission in the case of the scintillator or a pulse of electric current flowing across a junction, in the case of a semiconductor detector. The junction in the semiconductor detector may be a Schottky barrier or an ion-implanted or diffused junction.

Semiconductor detectors have the advantage over electrostatic and magnetic sector instruments that they are insensitive to the charge state of the incident ion or atom. However ΔE-E detector telescopes have a low energy threshold that corresponds to the energy where the range of the ion is just sufficient to penetrate right through the ΔE detector. To reduce the low-energy threshold as low as possible it is necessary to fabricate the ΔE detector as thin as possible.

PRIOR ART

The ΔE-E detector telescopes with the lowest threshold that are currently suitable for mass-production are based on a p-i-n structure formed in a self-supporting 10×10 mm area 10 μm Si membrane that is formed by etching (see Whitlow et al., Proc. 9th Australian Conf. on Nuclear Techniques of Analysis, Newcastle, Australia, Nov. 1995). The p-i-n structure can be formed by ion-implantation or diffusion (see J. Kremmer, Nucl. Instr. and Methods, Vol. 169, pp 499, 1980). These have a low energy threshold of about 1A MeV and can be stacked together to form arrays subtending large solid angles with little dead area because of the rectangular shape. Thinner detectors can be produced, however, the difficulty of controlling the etching, and the use of Au/Si Schottky junctions implies the resolution is dominated by the uniformity in the active thickness of the detector. The extreme fragility of the self-supporting Si membranes places a technical restriction on the minimum thickness and thereby the low energy threshold that can be achieved. This precludes the use of self-supporting membrane detectors in space crafts because of the G-forces and vibration during the launch phase. Kremmer and Lutz have proposed an ion-implanted n-p$^+$-n structure which is depleted from two sides (see Kremmer and Lutz, Nuclear Instrum. and Methods, A235, 365, 1978). In a further variant they propose using lateral drift fields to realize the separate collection of the ΔE and E signals. No data is presented from measurement with this type of detector. Possibly because the typical ±150% variations in the background doping will lead to significant variations in the ΔE layer thickness that will result in poor resolution.

Integrated detector telescopes, for instance according to FIG. 1, have been reported by a Japanese group about a decade or so ago (e.g. see Husimi et al., Nuclear Instr. and Methods, Vol 196, pp 131, 1982 and Y. Kim et al, Nuclear Instr. and Methods, Vol. 226, pp 125, 1984). This is based on epitaxial growth of a p-n-p structure. This integrated detector actually worked, however, the concept suffers from a number of drawbacks. The fact that epitaxy was used implies that it is not possible to obtain a well defined buried layer that forms the buried contact to the E and ΔE detector elements. This limits the minimum thickness of the thin detector and the thickness uniformity, which will be critically dependant on the gas dynamics during epitaxy. A potentially more serious problem is cross-coupling between the ΔE-E detector pair because the intense ionization along the ion track can form a plasma with a carrier concentration exceeding the doping concentration in the buried contact. Under these conditions the plasma can appreciably modify the local electric field round the plasma column and acts as a path for charge carriers between the E and ΔE detectors.

A U.S. Pat. No. 5,387,555 describes a method to create buried silicide layers with wafer bonding. However the method described contains also at least one insulating buried layer in contact with the buried silicide layer. Moreover the method according to this patent lacks a cooperating dopant for diffusion from the buried silicide layer.

Consequently it is found that there is a strong demand for an integrated semiconductor ΔE-E detector generally offering a good mechanical stability and presenting a ΔE-portion which may even withstand strong momentary mechanical forces, e.g. an acceleration, as well as also presenting a high resolution which will imply a very thin structure necessary for the ΔE portion of the detector. These two main demands will then be more or less contradictory to each other.

DESCRIPTION OF THE INVENTION

To avoid the problems discussed above the present invention suggests a structure consisting of a number of p-i-n diodes separated by metallic layers. The metallic layer between the devices ensures that there is no coupling between the different detector elements due to charge carrier funneling and minimizes image charge effects.

According to a main object of the present invention a detector telescope is formed with a very thin ΔE detector portion fabricated from a first silicon wafer which is bonded/silicidized to a second silicon wafer which forms the E detector portion of the detector telescope and thereby producing a well supported very thin ΔE detector for high resolution in the detector telescope, the very thin ΔE detector portion and the E detector portion between each other further present a buried metallic layer acting as a contact common to the two detectors, whereby the metallic layer is very thin and presents a low resistivity.

Other objects and advantages of different embodiments of the invention will be further defined in the dependent claims.

DESCRIPTION OF THE DRAWINGS

The invention, together with additional objects and advantages thereof, may best be understood by making reference to the following description taken together with the accompanying drawings where like designation numbers are used for same or corresponding members and in which.

EMBODIMENTS OF THE INVENTION

The system of a thin ΔE and thick E semiconductor detector in a telescope configuration, makes it possible to estimate an ionized particle's identity and energy. In most systems the thin ΔE detector is self supporting. However with an active area of 1 $cm^2$ and a thickness of the order of 10 $\mu$m or less, the detector is fragile and easily broken. According to the present invention the possibility to let the E-detector support the thin detector solves the problem concerning the mechanical instability and an integrated mechanically stable ΔE-E detector is created. When the low energy limit is set by the requirement that the particle must be able to traverse the ΔE detector, a thin detector, thinner than 10 $\mu$m, needs to be integrated. The integration also reduces the number of so-called dead layers from four to three. A layer buried between the ΔE and E detectors, a dead layer acting as an ohmic contact, is common to both detectors and must be thin and have a low resistivity. The buried layer may be formed by epilayer growth, wafer bonding or by implantation. The possibility to form a thin buried metallic layer in the semiconductor gives a small series resistance, therefore a small RC constant and fast charge carrier collection. Furthermore, the low resistivity in the buried metallic layer ensure minimal signal cross-talk between the two detectors due to charge carrier funneling (transport of charge carriers into/out of a depleted layer along the ion track due to transient distortion of the electric field brought about by the low resistivity plasma column along the ion track.)

Figure 1:
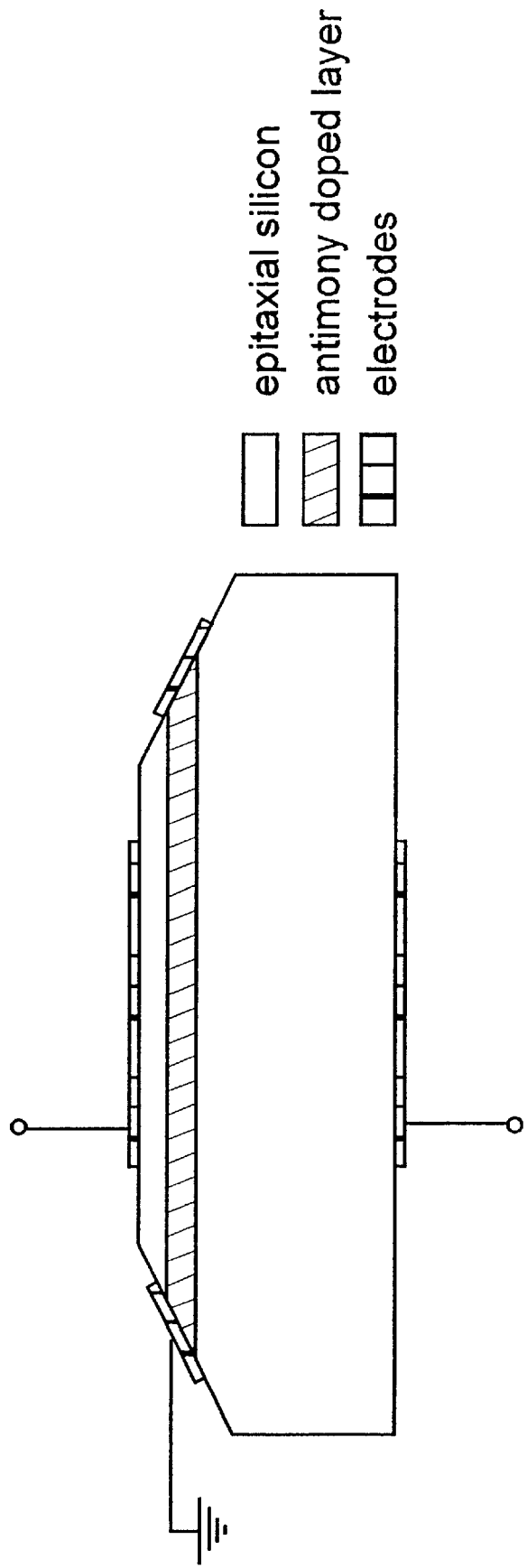
FIG. 1 demonstrates an integrated detector telescope structure based on epitaxial growth according to prior art.
Figure 2:
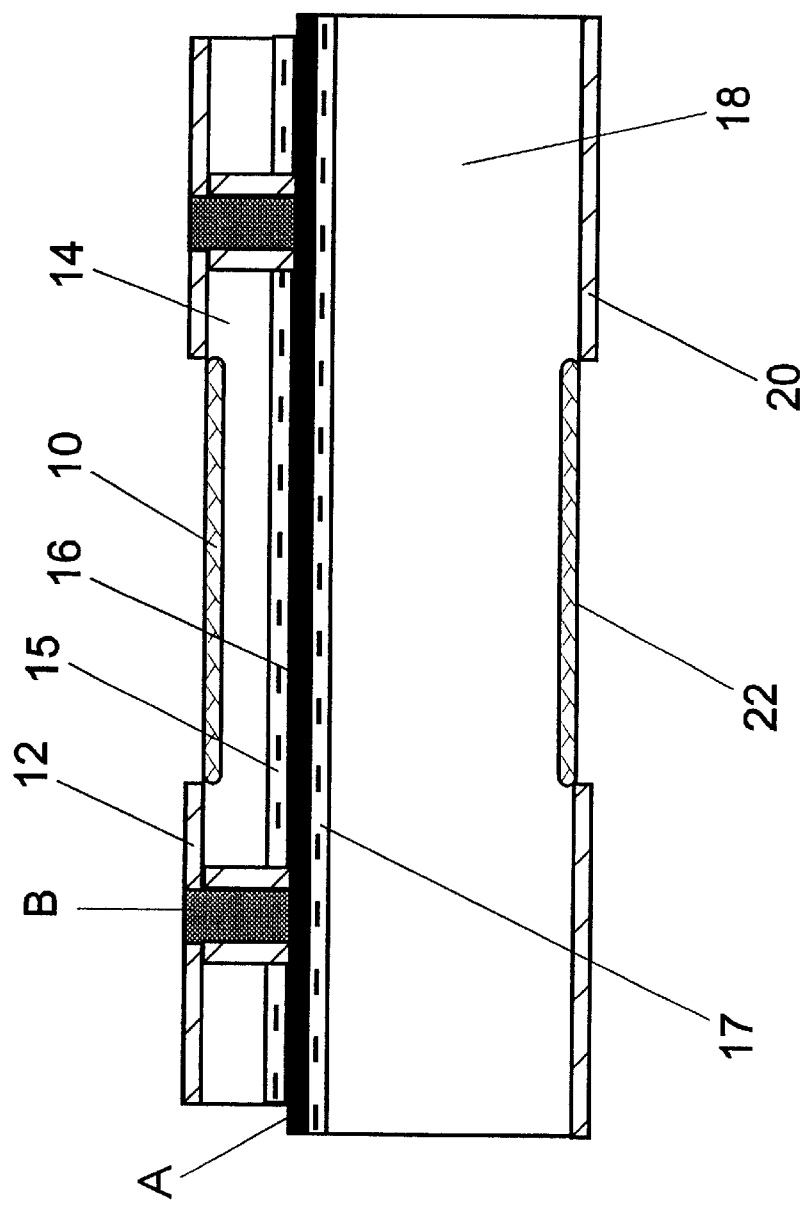
FIG. 2 shows an integrated ΔE-E detector according to a planar processing method according to the present invention.

FIG. 2 illustrates an integrated ΔE-E detector according to the present invention resulting from the planar processing method. The buried metallic layer 16 may either be connected by means of an edge contact A or by vias B. To maintain a low series resistance and minimize the minority carrier injection, highly doped ohmic contact layers 15 and 17 are created in between the metallic 16 and the semiconductor layers 14 and 18. Dielectric layers 12 and 20 are grown or deposited to passivate and protect the semiconductor. A barrier layer 10 is formed to create a p-n junction, a Schottky barrier junction or a heterojunction. Similarly another barrier layer 22 creates the corresponding function at the E detector semiconductor on the side opposite the ΔE detector.

An integrated detector was fabricated as illustrated in FIG. 2, and connected by an edge-contact A. A silicon wafer of a first type was cleaned in advance using with a standard cleaning process for 10 minutes in a solution of $H_2SO_4:H_2O_2$ having a volume ratio of 2.5:1 and then the wafer was rinsed during 5 min in deionized water. The thin oxide was removed by dipping the wafer into a solution of $H_2O:HF$, having a 10:1 volume ratio, until the wafer had a hydrophobic surface and it was then subsequently dried by blowing it with $N_2$ gas. The silicon wafer had a diameter of 7.6 cm (3 inches) and was grown by a floating zone technology, a surface normal orientation [111], a thickness 305 $\mu$m, phosphorus doped neutron induced, and having a resistivity of 15000 to 24000 $\Omega$cm was prepared with an n+ layer by implantation with arsenic. The arsenic was implanted with an energy of 70 keV to a dose of $4 \times 10^{15}$ $cm^{-2}$. The wafer was cleaned during 10 min in a solution of $H_2SO_4:H_2O_2$ with a volume ratio of 2.5:1 and subsequently rinsed for 5 min in deionized water. The thin oxide was subsequently removed by dipping the wafer into a solution $H_2O:HF$, with a volume ratio of 10:1, until the wafer had a hydrophobic surface. The wafer was then dried in blowing $N_2$ gas. A 30 nm (300 Å) thick layer of cobalt is electron-beam evaporated onto the silicon wafer. The evaporation was started at a base-pressure of $1 \times 10^{-8}$ mbar and during the evaporation the pressure rose to $9 \times 10^{-8}$ mbar at the deposition rate of 0.4 $nms^1$. After the evaporation the wafer was kept in the load-lock chamber until the second type of wafer was ready for the bonding process.

A silicon wafer of a second type with a diameter of 7.6 cm (3 inches) grown by floating zone technology, with a surface normal orientation [100], a thickness 100 $\mu$m, double side polished, phosphorus doped, and a resistivity of 100 to 300 $\Omega$cm was then covered on one side with a plasma chemical vapor deposited $SiO_2$-layer with a thickness of 1 $\mu$m. The thin oxide on the undeposited surface was removed by dipping the wafer into $H_2O:HF$, with a 10:1 volume ratio, until the wafer had a hydrophobic surface. The wafer was then dried in blowing $N_2$ gas. The first and second type of wafers were pressed together and a 100 g quarts plate was placed on top of the wafers in order to counteract bending caused by difference in thermal expansion of the buried layer 16 and the silicon wafers.

A bonding/silicidation was subsequently carried out in a $N_2$ atmosphere at 900° C. in a furnace for 30 min. The deposited $SiO_2$ layer protects the surfaces from impurity diffusion from the quarts plate. During the bonding/silicidation process some of the arsenic is incorporated in the buried silicide layer. The buried silicide layer then acts as a diffusion source for formation of an $n^+$ layer in the bonded [100] wafer. Further annealing increases the diffusion depth in the silicon.

A protecting layer of black-wax was then melted onto the [100]-wafer. The [111]-wafer was polished/etched in a solution of $HNO_3:CH_3COOH:HF$, having a volume ratio of 5:3.3, at 40° C. for 1 min. Then the bonded/silicidized wafers were cleaned for 5 min in a consecutive order in each of the following solutions: trichlor-ethylene, acetone, propyl alcohol and deionized water. The deposited $SiO_2$-layer was removed by a BHF solution (buffered HF) until the surface was hydrophobic. The bonded/silicidized wafers then were etched at 80° C. for 88 min in a solution of $KOH:H_2O$ having a weigth ratio of 1:1. Because the KOH etchant is an isotropic the [100]-wafer was etched ≈80 μm, while the [111]-wafer remained practically un-etched. The bonded/silicidized wafers were then rinsed in deionized water for 5 min, cleaned for 10 min in a solution of $H_2SO_4:H_2O_2$ with a volume ratio of 2.5:1 and then rinsed for 5 min in deionized water. Subsequently the [100]-wafer was covered with a plasma chemical vapor deposited $SiO_2$-layer with a thickness of 1 μm. In a lithographic etching process, etching notches were opened in the oxide. The resist was stripped and a short dipping of the bonded/silicidized wafers into a diluted HF solution removed the thin oxide in the opened etching notches.

The wafer provided with the etching notches then was etched during 10 min at 80° C. in a solution of $KOH:H_2O$ as described above, and was subsequently rinsed for 5 min in deionized water. The deposited $SiO_2$ layer was removed by a BHF solution until the surface was hydrophobic. To form trenches the wafer then was etched at 80° C. in a solution of $KOH:H_2O$ having a weight ratio 1:1 until the etching notches were fully opened (i.e. the etching was stopped down at the previous formed buried $CoSi_2$ layer). Then the thickness of the [100]-wafer was about 7 μm. The bonded/silicidized wafers were again rinsed in deionized water for 5 min, cleaned during 10 min in a solution of $H_2SO_4:H_2O_2$ having a volume ratio of 2.5:1 and then rinsed for 5 min in deionized water. The thin oxide was removed by a dipping of the wafers into $H_2O:HF$, having a volume ratio of 10:1, until the wafers had a hydrophobic surface and they were subsequently dried in blowing $N_2$ gas. After this the bonded/silicidized wafers were wet oxidized at 900° C. for 1 hour. The wet oxide passivates the silicon surfaces. Subsequently the wafers of type [100] and [111] both were deposited with a plasma chemical vapor which deposited a $SiO_2$-layer having a thickness of 1 μm. To increase the protection from diffusion of mobile ions and to improve the scratch resistance the surfaces were processed with a plasma chemical vapor which deposited a $Si_3N_4$ layer having a thickness of 145 nm (1450 Å). A ring pattern having a width of 5 mm surrounding the [100]-wafer was opened in the deposited oxide.

The wafer of type [100] then was etched at 80° C. in a solution of $KOH:H_2O$, having a weight ratio 1:1, until the ring pattern was opened (i.e. the etching was stopped at the earlier formed buried $CoSi_2$ layer). Thus the etched surrounding ring opened a contact (A) to the buried layer 16 of FIG. 2. The bonded/silicidized wafers were again rinsed in deionized water for 5 min, cleaned for 10 min in a solution of $H_2SO_4:H_2O_2$ having a volume ratio of 2.5:1. In an lithographic etching process step-aligned detector openings were created in the oxide on the wafers. The detector openings had a square shape 0.25 $cm^2$ with a 0.5 mm corner radius. The resist was stripped and the thin oxide etched in a dilute HF solution. A 30 nm (300 Å) thick layer of cobalt is then by means of an electron beam evaporated onto the wafers of both structure types ([100] and [111]). The evaporation condition was with a base pressure of $1 \times 10^{-8}$ mbar and during the evaporation, with a rate of 0.4 $nms^{-1}$, the pressure was $9 \times 10^{-8}$ mbar. The cobalt layers were silicidized in 800° C. for 15 min in a $N_2$-ambient to form $CoSi_2$.

Un-reacted cobalt was etched for 10 minutes in a solution of $H_2SO_4:H_2O_2$, having a volume ratio of 2.5:1, and then rinsed for 5 min in deionized water. Then the [100]-wafers were implanted with $BF_2$ having an energy of 90 keV and with a dose of $5 \times 10^{15}$ $cm^{-2}$. The [111]-wafers were implanted with B having an energy of 70 keV and with a dose of $2 \times 10^{15}$ $cm^{-2}$. The implanted boron was rendered electrically active during a 30 min heat treatment at 900° C. in an $N_2$ ambient. The processing was finished with a forming gas annealing at 450° C. for 30 min in 90% $N_2$ and 10%$H_2$.

From this process a ΔE-E detector according to FIG. 2 was achieved producing an integrated detector telescope with a very thin well supported ΔE detector presenting the desired thickness uniformity high resolution and the desired mechanical stability. The ΔE detector may then have a thickness ranging from up to 100 μm, and preferably of the order 7 μm or less for obtaining a low threshold energy for the ΔE detector.

In the described illustrative embodiment of the production of a ΔE-E detector device according to the present invention was illustrated for the case of phosphorous doped substrates, however the doping of the substrates could as well use other suitable dopants like for example boron, arsenic or antimony. In case of some other method, well known to a person skilled in the art, for etching down the first substrate should be used also a silicon wafer of a surface normal orientation of [111] could be used for the thin detector portion. The basic structure for the very thin ΔE detector structure could also consist of a deposited semiconductor layer of any suitable material as indicated above. A first semiconductor wafer could then after the bonding/silicidation process be etched away and be replaced by a thin deposited semiconductor layer by applying known techniques.

The buried metal need not be pure metal but may be compounds with a suitable metallic electronic structure of a nitride, eg., TiN, or a silicide, e.g. $TiSi_2$, PtSi, $WSi_2$, or $CoSi_2$. In the same manner different types of semiconductor substrates could also be used, for instance silicon, silicon germanium, silicon carbide, gallium arsenide and indium phosphide.

Figure 3:
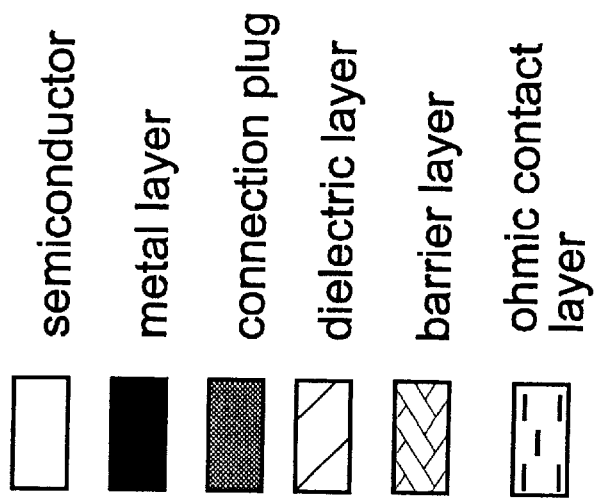
FIG. 3 shows a detector where the barrier layer is formed as a metallic layer with the metallic layer as a common contact.
Figure 3:
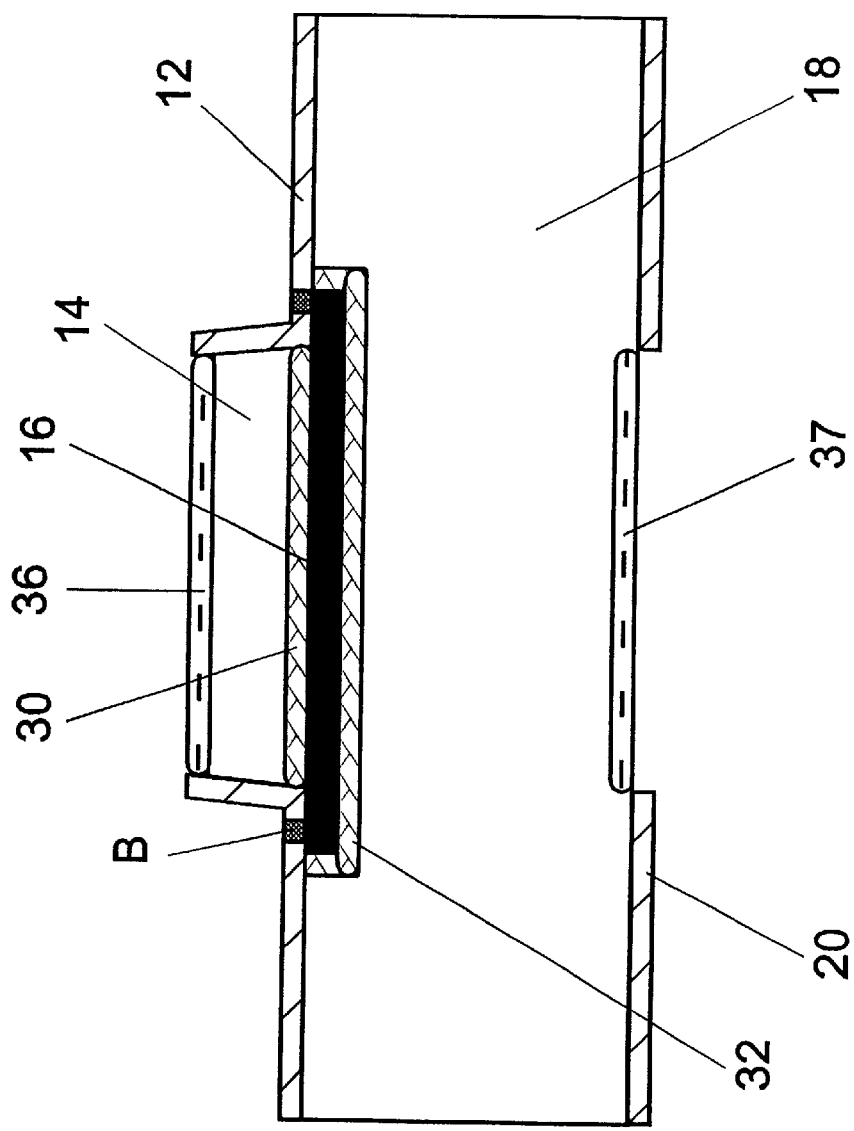

FIG. 3 demonstrates an alternative embodiment of a telescope ΔE-E detector according to the invention. In FIG. 3 the barrier layers are formed as buried layers 30, 32 with the buried metallic layer 16 as a comm on contact. The connection to the metallic layer is done by the connection plugs B. The shape of the ΔE detector presented is produced for instance with mesa etching using a technique well known by a person skilled in the art. The front and back ohmic contacts 36, 37 are fabricated with a highly doped layer. Thus the detector of FIG. 3 will be fabricated in a similar way as the one described with reference to FIG. 2 by changing the order of certain process steps already known by a person skilled in the art.

Figure 4:
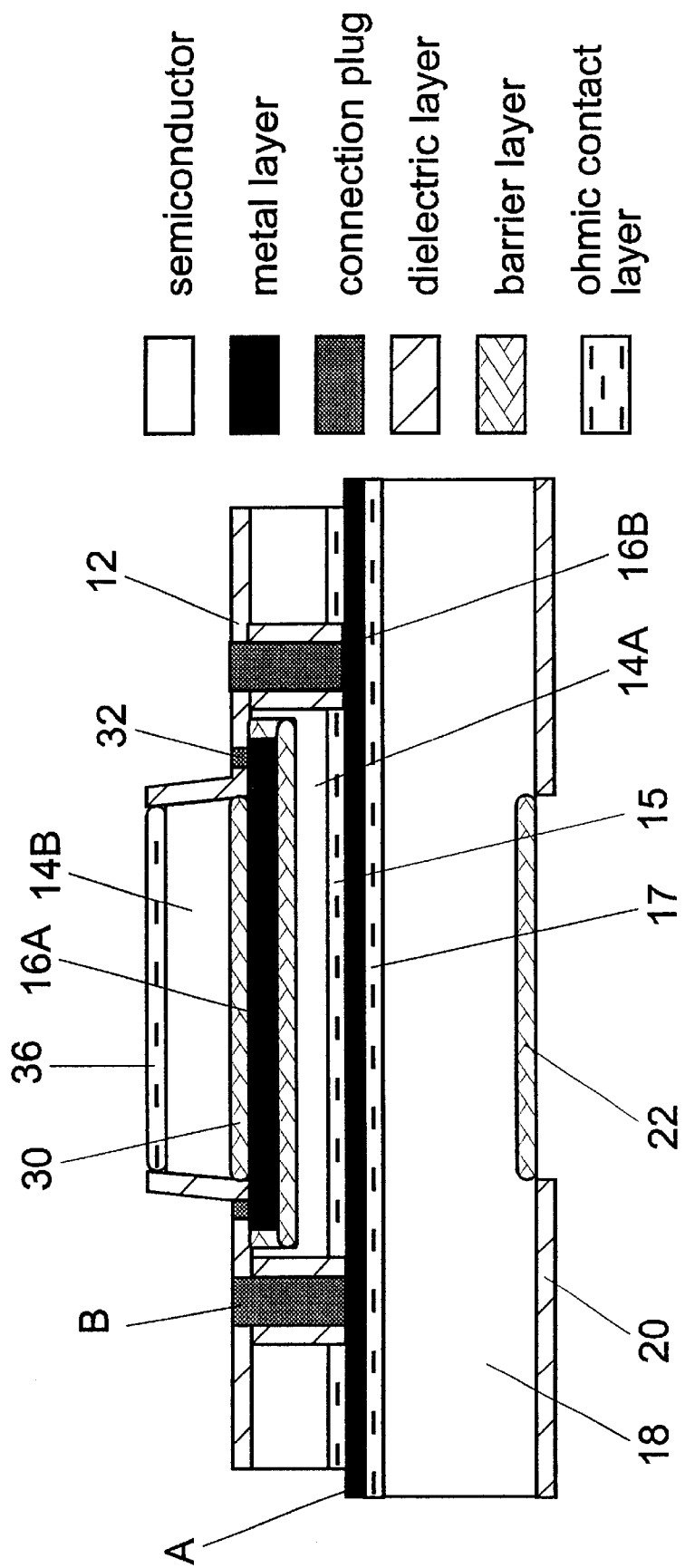
FIG. 4 shows a high resolution detector system consisting of a triple telescope.

FIG. 4 demonstrates a further embodiment of a detector in accordance with the present invention. In FIG. 4 a high resolution detector system is illustrated which is based on a triple detector telescope. This $\Delta E_1/\Delta E_2/E$ detector telescope will be considered as a combination of the two previous discussed detector systems presented in FIGS. 2 and 3. Here two buried metallic layers 16A and 16B are found as well as two semiconductor layers 14A, 14B which constitute the ΔE detectors and a third semiconductor layer 18 acting as an E detector. The remaining elements are the same as those presented in FIGS. 2 and 3. Consequently, this triple detector will be considered as a further embodiment of the present invention.

Thus, it will be possible, according to the present invention, to create a detector telescope containing a number of different ΔE detector portions on top of a common E detector portion, thereby creating a solid state Bragg-Curve Detector to simultaneously measure the identity and energy of energetic ions. In such a device the thin p-i-n diode detectors can be read out individually using standard charge sensitive pre-amplifiers. The metallic layer between the devices ensures there is no coupling between the different thin p-i-n element detectors due to charge carrier funneling and minimizes image charge effects.

Such a device will achieve a much faster read-out because the detector does not rely the drift of electrons to an anode under the action of an electric field. Additionally the device may be made very compact because the atomic density of semiconductors and metals is much higher than for gases. The device will also be very rugged which makes it suitable for space-probe applications. Only low voltages, of the order 50 V, will be needed because the individual p-i-n diodes will be depleted with very low applied voltage.

It will be understood by those skilled in the art that various modifications and changes may be made to the present invention without departure from the spirit and scope thereof, which is defined by the appended claims.

What is claimed is:

1. A device forming a low threshold energy, low cross talk and high energy resolution integrated semiconductor detector telescope having a very thin well-supported ΔE detector portion and a low resistivity metal interlayer, wherein a ΔE-E detector telescope is fabricated by wafer bonding a ΔE detector portion in the form of a first semiconductor wafer to an E detector portion in the form of a second semiconductor wafer by silicidizing a thin metal layer, said thin metal layer acting as a common contact between the two detectors, whereby said metallic layer explicit is thin and represents a small dead-layer and a low resistivity, thereby minimizing cross-talk between the ΔE and E detector portions.

2. The device according to claim 1, wherein said first and second semiconductor wafers comprise a suitably doped silicon substrate of a surface normal orientation [100] or [111], whereby the dopant may be phosphorous, boron, arsenic or antimony.

3. The device according to claim 1, wherein said second semiconductor wafer comprise a silicon substrate with neutron-induced phosphorous doping and with a surface normal orientation [111].

4. The device according to claim 1, wherein said first or second semiconductor wafers comprise silicon, silicon germanium, silicon carbide, gallium arsenide or indium phosphide.

5. The device according to claim 1, wherein said very thin ΔE detector portion presents a thickness ranging up to 100 µm.

6. The device according to claim 1, wherein said metallic layer on each side is additionally provided with highly doped ohmic contact layers to maintain a low series resistance and to minimize minority carrier injection.

7. The device according to claim 1, wherein said metallic layer on each side is provided with a barrier layer one said bearing layer creating a p-n junction, a Schottky barrier junction or a heterojunction.

8. The device according to claim 2, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

9. The device according to claim 3, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

10. The device according to claim 4, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

11. The device according to claim 5, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

12. The device according to claim 6, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

13. The device according to claim 7, wherein a triple detector telescope containing a first $\Delta E_1$ detector portion and a second $\Delta E_2$ detector portion which are combined with said second silicon wafer forming said E detector portion, whereby said second $\Delta E_2$ detector portion is bonded/silicidized to said E detector portion and in which detector telescope said second $\Delta E_2$ detector portion in turn is bonded/silicidized to said first $\Delta E_1$ detector portion.

14. The device according to claim 7, wherein said ΔE detector portion includes a first $\Delta E_1$ detector portion which is a very thin detector and a second $\Delta E_2$ detector portion which presents a several times thicker ΔE detector portion.

15. The device according to claim 1, wherein a detector telescope is created containing a number of different ΔE detector portions on top of a common E detector portion and having each detector separated by a metallic layer, thereby creating a solid state Bragg-Curve Detector to simultaneously measure the identity and energy of energetic ions.

16. The device according to claim 6, wherein a detector telescope is created containing a number of different ΔE detector portions on top of a common E detector portion and having each detector separated by a metallic layer, thereby creating a solid state Bragg-Curve Detector to simultaneously measure the identity and energy of energetic ions.

* * * * *